United States Patent [19]

Kurz

[11] Patent Number: 4,987,517

[45] Date of Patent: Jan. 22, 1991

[54] AFFIXATION OF MOUNTING BRACKETS TO COMPUTER CIRCUIT BOARDS

[76] Inventor: Arthur A. Kurz, Wildlife Run, New Vernon, N.J. 07976

[21] Appl. No.: 375,130

[22] Filed: Jul. 3, 1989

[51] Int. Cl.⁵ .............................................. H05K 7/02
[52] U.S. Cl. ...................................... 361/417; 29/845; 361/419; 361/420; 361/427
[58] Field of Search .................. 211/41; 361/394, 395, 361/399, 413, 415, 417, 419–420, 427; 364/708; 29/842, 844, 845, 522.1

[56] References Cited

U.S. PATENT DOCUMENTS

| | | | |
|---|---|---|---|
| 4,716,499 | 12/1987 | Bhargava | 361/395 |
| 4,745,524 | 5/1988 | Patton, III | 361/413 |
| 4,791,524 | 12/1988 | Teigen et al. | 361/427 |

Primary Examiner—Gregory D. Thompson
Attorney, Agent, or Firm—Samuelson & Jacob

[57] ABSTRACT

A mounting bracket is affixed to a computer circuit board by tubular projections formed unitary with mounting lugs on the mounting bracket and passed through complementary mounting holes in the circuit board, the tubular projections being upset to establish a flanged headed portion on each tubular projection, which flanged headed portion is urged against the circuit board with a controlled force to clamp the circuit board between the flanged headed portion and the mounting lug with a securing force which is independent of variations in the thickness of the circuit board.

5 Claims, 2 Drawing Sheets

AFFIXATION OF MOUNTING BRACKETS TO COMPUTER CIRCUIT BOARDS

BACKGROUND OF THE INVENTION

The present invention relates generally to the mounting of circuit boards in computers and pertains, more specifically, to the affixation of mounting brackets to the circuit boards, the mounting brackets providing the means by which the circuit boards are mounted within the computer.

Smaller computers, generally known as personal computers, have gone into widespread use, at home as well as in industrial and commercial applications, and now are manufactured in large numbers. As a part of their basic design and construction, these computers provide for the convenient installation of supplemental circuit boards which are mounted in the computer in order to provide a variety of optional functions. The circuit boards each are supplied to customers with a standard mounting bracket already fastened to an edge of the circuit board so that installation merely requires placement of the assembled circuit board and mounting bracket within the computer and the securement of the mounting bracket to the computer itself. The mounting bracket is fastened to the circuit board by the manufacturer of the circuit board, usually through the use of threaded fasteners which secure arms of the mounting bracket to the circuit board, adjacent an edge of the circuit board.

SUMMARY OF THE INVENTION

The present invention provides a securing arrangement and method which enables affixation of a mounting bracket to a circuit board, adjacent an edge of the circuit board, with greater ease and economy and exhibits several objects and advantages, some of which may be summarized as follows: Enables ease and economy in that affixation is accomplished without the use of supplemental fasteners; eliminates supplemental fastener elements and the concomitant danger of loose parts creating short circuits and other electrical damage, as well as mechanical damage, to the computer; provides compensation for variations in thickness in circuit boards without affecting the security of the affixation of a mounting bracket to a circuit board; resists crushing of the circuit board, through the use of controlled fastening forces; enables effective grounding connections between the mounting bracket and the circuit board; and promotes ease of manufacture in large quantities of uniform high quality.

The above objects and advantages, as well as further objects and advantages, are attained by the present invention, which may be described briefly as an improvement in a method and in an arrangement for affixing a mounting bracket to a computer circuit board, along one edge of the circuit board, the circuit board having a thickness adjacent the one edge and including mounting holes having a given diameter and passing through the thickness of the circuit board adjacent the one edge. The improvement includes providing the mounting bracket with mounting surfaces, hollow tubular projections projecting from the mounting surfaces at locations corresponding to the locations of the mounting holes, the tubular projections each having opposite ends, an outer diameter generally complementary to the given diameter of the corresponding mounting holes and a length extending from one of the opposite ends, at which one end the corresponding tubular projection is integral with the mounting bracket at the corresponding mounting surface thereof, to the opposite end, the length being greater than the thickness of the circuit board adjacent the one edge thereof. The hollow tubular projections are inserted into the corresponding mounting holes and extended through the circuit board such that each mounting surface is engaged with the circuit board at the one end of each tubular projection and the opposite end of each tubular projection projects beyond the circuit board. The opposite end of each tubular projection is upset toward the circuit board to establish a flanged headed portion at the opposite end of the tubular projection, and each flanged headed portion is urged toward the one end of the corresponding tubular projection until the circuit board is engaged by the mounting surfaces and the flanged headed portions to secure the mounting bracket in place upon the circuit board adjacent the one edge thereof.

The invention will be understood more fully, while still further objects and advantages will become apparent, in the following detailed description of preferred embodiments of the invention illustrated in the accompanying drawing, in which:

DESCRIPTION OF THE PREFERRED EMBODIMENT

Figure 1:
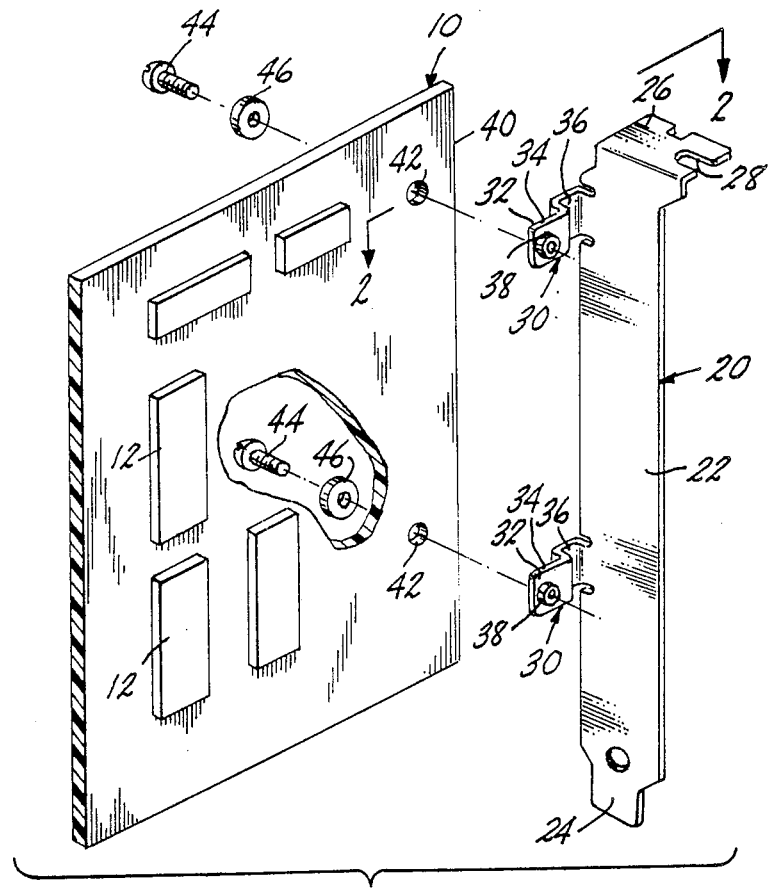
FIG. 1 is an exploded perspective view of a mounting bracket about to be affixed to a computer circuit board in accordance with current prior art techniques.
Figure 2:
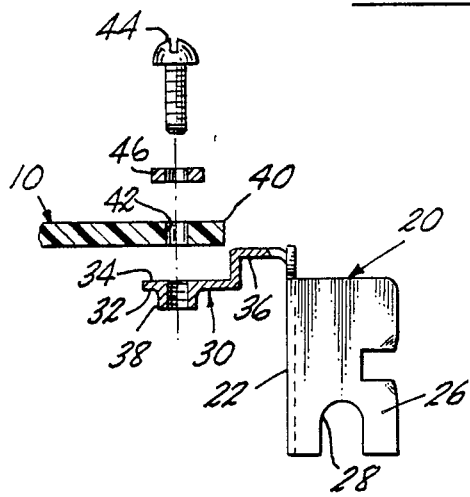
FIG. 2 is an enlarged fragmentary cross-sectional view of a portion of FIG. 1, taken along line 2—2 of FIG. 1.

Referring now to the drawing, an especially to FIGS. 1 and 2 thereof, a computer circuit board 10 carries a plurality of circuit components 12 and is to be secured within a computer (not shown) by means of a mounting bracket 20 which is to be affixed to the circuit board 10. Mounting bracket 20 includes a plate 22 having a tongue 24 at one end thereof and a tab 26 at the other end. Mounting bracket 20 is to be secured to the computer chassis (not shown) by inserting the tongue 24 into a corresponding slot provided in the computer chassis and then clamping the tab 26 to the chassis by means of a threaded fastener which is to be passed through a slot 28 provided in the tab 26 for that purpose, all in a manner now well known in computer construction. A pair of securing arms 30 are formed unitary with the plate 22 and project essentially normal to the plane of plate 22, the arms 30 each having a mounting lug 32 with a mounting surface 34 and an offset portion 36 between the mounting lug 32 and the plate 22. A threaded collar 38 is formed integral with each mounting lug 32 and projects from the mounting lug 32, opposite the mounting surface 34, in the direction away from the circuit board 10.

Figure 3:
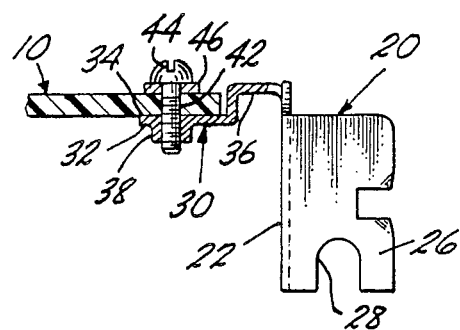
FIG. 3 is an enlarged fragmentary cross-sectional view similar to FIG. 2, but with the component parts assembled.

The mounting bracket 20 is to be affixed to the circuit board 10 along one edge 40 of the circuit board 10, and mounting holes 42 extend through the circuit board 10 adjacent the one edge 40 and in alignment with the respective threaded collars 38 of the mounting lugs 32. The mounting bracket 20 and the circuit board 10 are brought into alignment with one another, as shown, and a corresponding threaded fastener 44 is passed through a washer 46 and then through each hole 42 to be threaded into each collar 38 and tightened, as seen in FIG. 3, to affix the mounting bracket 20 to the circuit board 10, with the one edge 40 nested alongside the offset portion 36.

Figure 4:
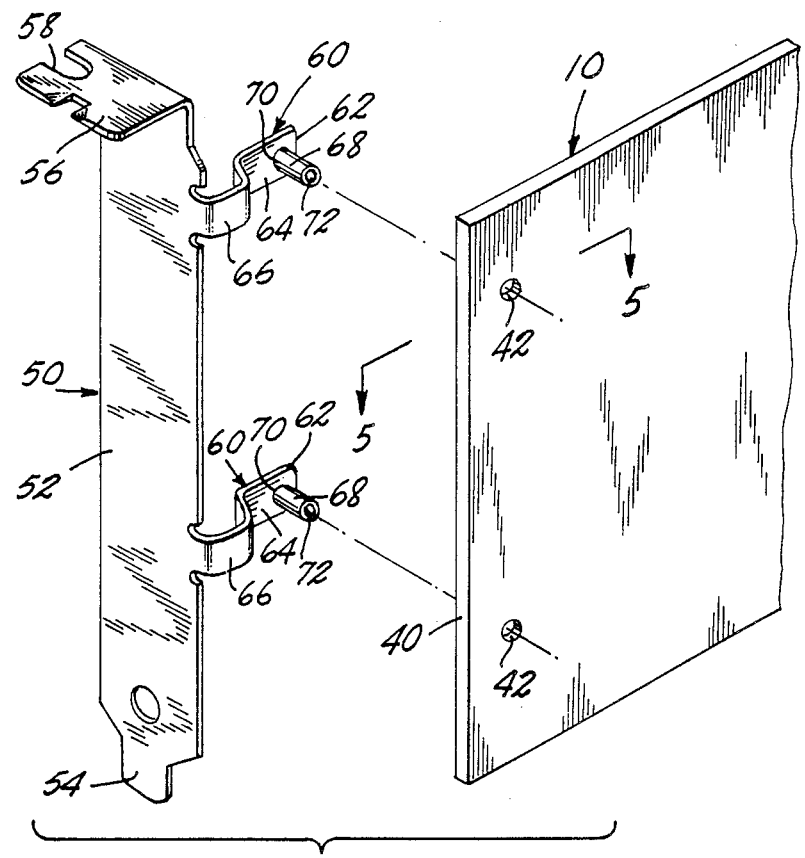
FIG. 4 is an exploded perspective view of a mounting bracket about to be affixed to a computer circuit board in accordance with the present invention.
Figure 5:
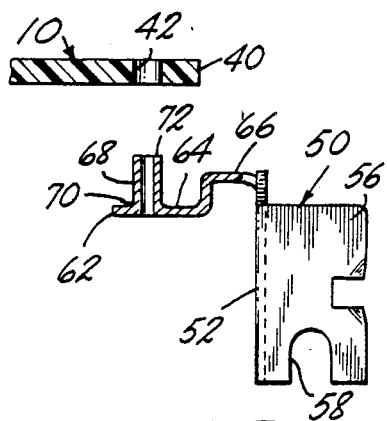
FIG. 5 is an enlarged fragmentary cross-sectional view of a portion of FIG. 4, taken along line 5—5 of FIG. 4.

The present, invention provides an improvement over the above-described prior art construction in that the construction and affixation procedure are simplified, require fewer component parts and less complex operations, and offer increased reliability. Thus, as seen in FIGS. 4 and 5, an improved mounting bracket 50 is to be affixed to the same circuit board 10 and includes a plate 52 having a tongue 54 at one end thereof and a tab 56 at the other end. Mounting bracket 50 is to be secured to the computer chassis (not shown) in the same manner as described above in connection with mounting bracket 20, that is, by means of a threaded fastener which is to be passed through a slot 58 provided in the tab 56 for that purpose. A pair of securing arms 60 are formed unitary with the plate 52 and project essentially normal to the plane of plate 52, the arms 60 each having a mounting lug 62 with a mounting surface 64 and an offset portion 66 between the mounting lug 62 and the plate 52. However, in the improvement of the present invention, a tubular projection 68 is formed integral with each mounting lug 62 and projects from the mounting surface 64, essentially normal thereto, toward the circuit board 10. Preferably, the tubular projections 68 are formed unitary with the mounting lugs 62 and the mounting bracket 50 is a one-piece, unitary construction. In the illustrated embodiment, the tubular projections 68 each extend from a first end 70, unitary with the mounting lug 62, to a free second end 72, opposite the first end 70.

Figure 6:
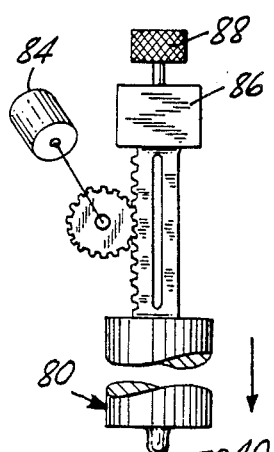
FIG. 6 is an enlarged fragmentary cross-sectional view similar to FIG. 5, but with the component parts partially assembled.
Figure 7:
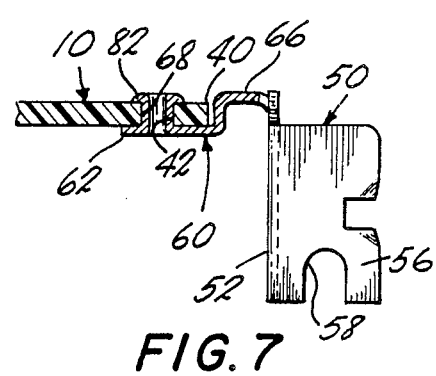
FIG. 7 is a view similar to FIG. 6, but with the component parts fully assembled.

The tubular projections 68 each have a length between the ends 70 and 72 which exceeds the thickness of the circuit board 10 at the one edge 40 thereof and are in position for alignment with the mounting holes 42 in the circuit board 10 so that the tubular projections 68 may be inserted into the respective mounting holes 42, as seen in FIG. 6, and will pass through the mounting holes 42 to extend the second end 72 of each tubular projection 68 beyond the circuit board 10, as shown. Subsequently, a deforming tool 80 is forced against the second end 72 of each tubular projection 68 to upset the second end 72 and establish a permanently deformed flanged headed portion 82 at the second end 72 of the tubular projection 68, as illustrated in FIG. 7. Tool 80 is driven against second end 72 by drive means in the form of an actuator 84. A force-limiting device 86 is associated with and acts in concert with the actuator 84 and the tool 80 and includes a selector 88 for selecting the maximum force with which the tool 80 is driven against the second end 72 of the tubular projection 68. In this manner, the one edge 40 of the circuit board 10 is clamped between the mounting surface 64 of each mounting lug 62 and the flanged headed portion 82 of a corresponding tubular projection 68 with a controlled clamping force selected for secure affixation of the mounting bracket 50 to the circuit board 10, without crushing or otherwise damaging the material of the circuit board 10. Since the clamping force is controlled by force-limiting device 86, the selected clamping force is attained independent of the thickness of the circuit board 10, and slight variations in that thickness are accommodated without deleterious consequences. Thus, the mounting bracket 50 is affixed securely to the circuit board 10 with the one edge 40 of the circuit board 10 nested alongside the offset portion 66 of the mounting lug 62 in a simplified completed assembly. The assembly utilizes only the one-piece mounting bracket 50, with no additional fastener elements required, so that not only is the assembly procedure simplified, but parts inventory is reduced and the danger of loose parts falling into the computer and causing either electrical or mechanical failure is eliminated, both at the time of assembly and during subsequent use of the circuit board 10 in the computer.

It will be seen that the present improvement attains the several objects and advantages summarized above; namely, the improvement enables ease and economy in that affixation is accomplished without the use of supplemental fasteners; eliminates supplemental fastener elements and the concomitant danger of loose parts creating short circuits and other electrical damage, as well as mechanical damage, to the computer; provides compensation for variations in thickness in circuit boards without affecting the security of the affixation of a mounting bracket to a circuit board; resists crushing of the circuit board through the use of controlled fastening forces; enables effective grounding connections between the mounting bracket and the circuit board; and promotes ease of manufacture in large quantities of uniform high quality.

It is to be understood that the above detailed description of preferred embodiments of the invention is provided by way of example only. Various details of design, construction and procedure may be modified without departing from the true spirit and scope of the invention as set forth in the appended claims.

The embodiments of the invention in which an exclusive property or privilege is claimed are defined as follows:

1. In the method of affixing a mounting bracket to a computer circuit board, along one edge of the circuit board, the circuit board having a thickness adjacent the one edge and including mounting holes having a given diameter and passing through the thickness of the circuit board adjacent the one edge, the improvement including:

providing the mounting bracket with mounting surfaces, hollow tubular projections projecting from the mounting surfaces at locations corresponding to the locations of the mounting holes, the tubular projections each having opposite ends, an outer diameter generally complementary to the given diameter of the corresponding mounting holes and a length extending from one of the opposite ends, at which one end the corresponding tubular projection is integral with the mounting bracket at the corresponding mounting surface thereof, to the opposite end, the length being greater than the thickness of the circuit board adjacent the one edge thereof;

inserting the hollow tubular projections into the corresponding mounting holes and extending the tubular projections through the circuit board such that each mounting surface is engaged with the circuit board at the one end of each tubular projection and the opposite end of each tubular projection projects beyond the circuit board;

upsetting the opposite end of each tubular projection toward the circuit board to establish a flanged headed portion at the opposite end of each tubular projection; and urging each flanged headed portion toward the one end of the corresponding tubular projection until the circuit board is engaged by the mounting surfaces and the flanged headed portions to secure the mounting bracket in place upon the circuit board adjacent the one edge thereof.

2. The improvement of claim 1 wherein the urging of the corresponding flanged headed portion of each tubular projection is accomplished with an upsetting force and the improvement includes controlling the upsetting force to control the force exerted upon the circuit board by the urging of the corresponding flanged headed portion toward the corresponding mounting surface.

3. The improvement of claim 1 wherein the thickness of the circuit board adjacent the one edge thereof is indeterminate and wherein the urging of the corresponding flanged headed portion of each tubular projection is accomplished with an upsetting force, and the improvement includes controlling the upsetting force to control the force exerted upon the circuit board by the urging of the corresponding flanged headed portion toward the corresponding mounting surface, independent of the thickness of the circuit board adjacent the one edge thereof.

4. In a mounting arrangement for affixing a mounting bracket to a computer circuit board, along one edge of the circuit board, the circuit board having a thickness adjacent the one edge and including mounting holes having a given diameter and passing through the thickness of the circuit board adjacent the one edge, the improvement including:

mounting surfaces on the mounting bracket;

hollow tubular projections projecting from the mounting surfaces at locations corresponding to the locations of the mounting holes, the tubular projections each having opposite ends, an outer diameter generally complementary to the given diameter of the corresponding mounting holes in the circuit board and a length extending from one of the opposite ends, at which one end the corresponding tubular projection is integral with the mounting bracket at the corresponding mounting surface thereof, to the opposite end, the length being greater than the thickness of the circuit board adjacent the one edge thereof so that the hollow tubular projections may be inserted into the corresponding mounting holes to extend the tubular projections through the circuit board such that each mounting surface will be engaged with the circuit board at the one end of each tubular projection and the opposite end of each tubular projection will project beyond the circuit board, whereby the opposite end of each tubular projection may be upset toward the circuit board so as to provide a flanged headed portion at the opposite end of each tubular projection, with each flanged headed portion urged toward the first end of the corresponding tubular projection such that the circuit board will be engaged by the mounting surfaces and by the flanged headed portions to secure the mounting bracket in place upon the circuit board adjacent the one edge thereof.

5. The improvement of claim 4 wherein the tubular projections each are unitary with the mounting bracket.

* * * * *